United States Patent [19]

Ishizuka et al.

[11] Patent Number: 4,933,673
[45] Date of Patent: Jun. 12, 1990

[54] ENCODER

[75] Inventors: Koh Ishizuka, Urawa; Tetsuharu Nishimura, Kawasaki; Masaaki Tsukiji; Satoshi Ishii, both of Tokyo, all of Japan

[73] Assignee: Canon Kabushiki Kaisha, Tokyo, Japan

[21] Appl. No.: 171,435

[22] Filed: Mar. 21, 1988

[30] Foreign Application Priority Data

Mar. 24, 1987 [JP] Japan ................. 62-069937

[51] Int. Cl.$^5$ ............................................ H03M 1/22
[52] U.S. Cl. ............................................ 341/13; 341/2
[58] Field of Search ................ 341/2, 3, 5, 6, 8, 10, 341/13, 17

[56] References Cited

U.S. PATENT DOCUMENTS 4,146,873  3/1979  Yamanaka et al. ....... 340/146.1 AG
4,301,447  11/1981  Funk et al. ..................... 341/13
4,465,928  8/1984  Breslow ........................ 341/13
4,572,952  2/1986  March ........................... 341/9
4,588,982  5/1986  Goodwin ....................... 341/13
4,621,256  11/1986  Rusk ............................. 341/3

Primary Examiner—William M. Shoop, Jr.
Assistant Examiner—Gary J. Romano
Attorney, Agent, or Firm—Fitzpatrick, Cella, Harper & Scinto

[57] ABSTRACT

An encoder for detecting the state of movement of a scale having a plurality of tracks consisting of arranged predetermined codes comprises first detecting device for reading the codes of the plurality of tracks and detecting data comprising a row of the codes, and second detecting device for detecting the state of movement of the codes of a particular track plurality of tracks to obtain more detailed data. The state of movement of the scale is detected on the basis of the signals from the first and second detecting devices.

5 Claims, 4 Drawing Sheets

ENCODER

BACKGROUND OF THE INVENTION

1. Field of the Invention

This invention relates to an encoder for measuring the amount of displacement resulting from rotation, movement or the like of an object to be measured. In particular, disclosed is an absolute type encoder which is capable of obtaining raw electrical data row due to the presence or absence of the reflected or transmitted light of a light beam entering a plurality of track portions provided on a code plate connected to an object to be measured, and finding the absolute position of the object to be measured therefrom.

2. Related Background Art

A photoelectric encoder has heretofore often been utilized as an apparatus for detecting the rotation, movement, position or the like of an object to be measured for detecting the amount and speed of rotation of a rotational mechanism.

FIG. 1 of the accompanying drawings is a schematic view showing an example of the absolute type encoder according to the prior art for measuring the position or the absolute amount of displacement of an object to be measured. In FIG. 1, the reference numeral 41 designates a rotational disc rotatable about a rotary shaft 40. A plurality of tracks are provided concentrically on the rotational disc 41 to generate binarized data in conformity with any angular position of the rotational disc 41. Optically binarized data, for example, a plurality of slits 42 each comprising a transmitting area and a non-transmitting area, are provided regularly on each track, and a particular data row is formed radially of the rotational disc 41. The reference numeral 43 denotes a fixed slit row which has a plurality of openings to selectively pass the light from the slits provided on each track and constitutes a slit row along the radial direction of the rotational disc 41. The reference numeral 44 designates light-projecting means having a plurality of light-projecting elements, and the reference numeral 45 denotes light-receiving means having a plurality of light-receiving elements. These two means are disposed with the rotational disc 41 and the fixed slit row 43 interposed therebetween so that each light-projecting element and each light-receiving element correspond to each opening of the fixed slit row 43 and each track of the rotational disc 41.

In the construction shown in FIG. 1, the light beam radiated from each light-projecting element of the light-projecting means 44 passes through the slits 42 and the fixed slits 43 to the light-receiving means 45. At this time, a row of data is read from a combination of the output signals of the light-receiving elements to thereby find the precise position of the rotational disc 41. The detected resolving power of the rotated position of the rotational disc 41 in such an apparatus becomes dependent on the number of tracks on the rotational disc 41.

That is, to enhance the detected resolving power, it is necessary to increase the number of tracks disposed on the rotational disc 41 and increase the combined elements.

However, an increase in the number of tracks leads to a greater diameter of the rotational disc 41 which in turn leads to the bulkiness of the entire apparatus and also to an increased number of signal output systems, which results in the problem that signal processing becomes complicated.

SUMMARY OF THE INVENTION

It is an object of the present invention to provide an encoder which is capable of improving the resolving power without increasing the number of tracks.

To achieve the above object, the encoder of the present inaction is an encoder for detecting the state of movement of a scale having a plurality of tracks comprising predetermined codes.

The invention includes a by first detecting means for reading the codes of said plurality of tracks and detecting data comprising a row of said codes, and a second detecting means for detecting the state of movement of the code of a particular track on the scale. The state of movement of said scale is detected on the basis of the signals from said first and second detecting means.

Further features and a specific form of the present invention will become apparent from the following detailed description of an embodiment of the invention.

DESCRIPTION OF THE PREFERRED EMBODIMENT

Figure 1:
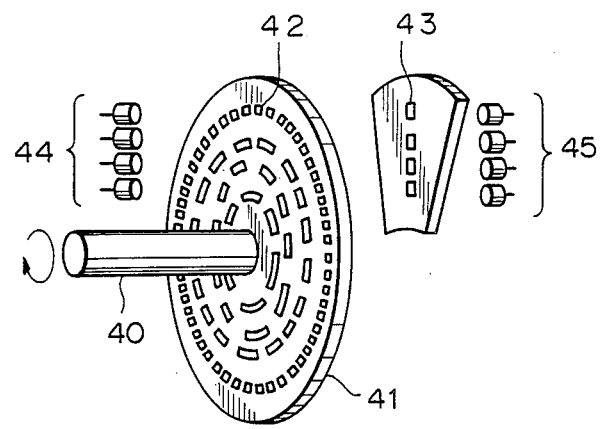
FIG. 1 is a schematic view showing an example of the absolute type encoder according to the prior art.
Figure 2:
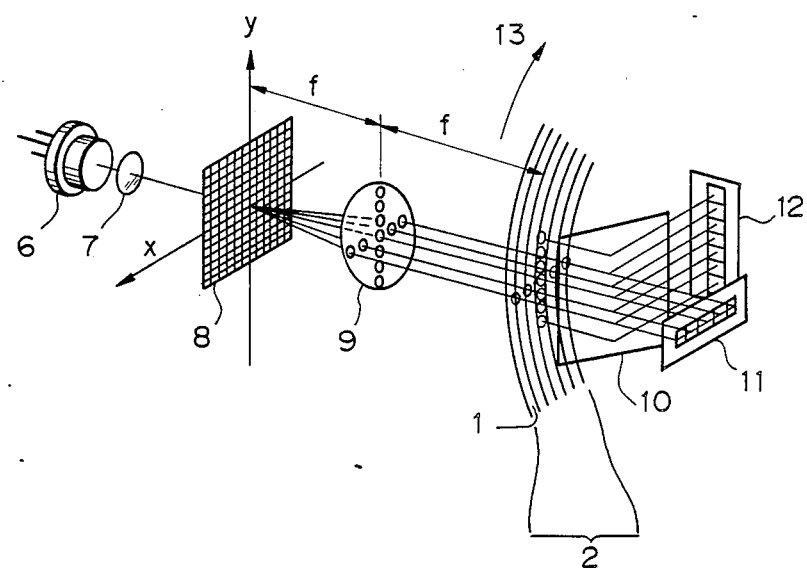
FIG. 2 schematically shows the construction of an embodiment of the present invention.

FIG. 2 is a shematic view of an embodiment in which the present invention is applied to a rotary encoder. In FIG. 2, the reference numeral 1 designates a rotational scale as an object to be measured, the reference numeral 2 denotes a code plate provided on the rotational scale 1 and comprising a plurality of tracks, the reference numeral 6 designates a light source such as a laser diode, the reference numeral 7 denotes a collimator lens, the reference numeral 8 designates an orthogonal diffraction grating plate formed with gratings in two directions x and y, the reference numeral 9 denotes a lens, the reference numeral 10 designates a half-mirror, and the reference numerals 11 and 12 denote first detecting means and second detecting means, respectively. These detecting means each have a light-receiving element array comprising a plurality of light-receiving elements. The arrow 13 indicates the direction of rotation of the rotational scale 1.

The orthogonal diffraction grating plate 8 is disposed at the forward focus position of the lens 9, and the code plate 2 (the rotational scale 1) is disposed at the rearward focus position of the lens 9, and these forms a so-called F—F arrangement as shown. Accordingly, a parallel light beam entering the lens 9 is efficiently condensed (imaged) on the code plate 2.

A light beam emitted from the light source 6 is collimated by the collimator lens 7 and enters the orthogonal diffraction grating plate 8. At this time, diffracted lights comprising a plurality of parallel light beams are emitted at an angle determined by the grating pitches of the orthogonal diffraction grating plate 8 in the directions x and y. These diffracted lights are made into light beams parallel to each other by the lens 9, and are respectively condensed one by one on the respective tracks 2a–2i of the code plate 2 on the rotational scale 1 positioned on the Fourier conversion surface of the orthogonal diffraction grating plate 8.

Figure 3A:
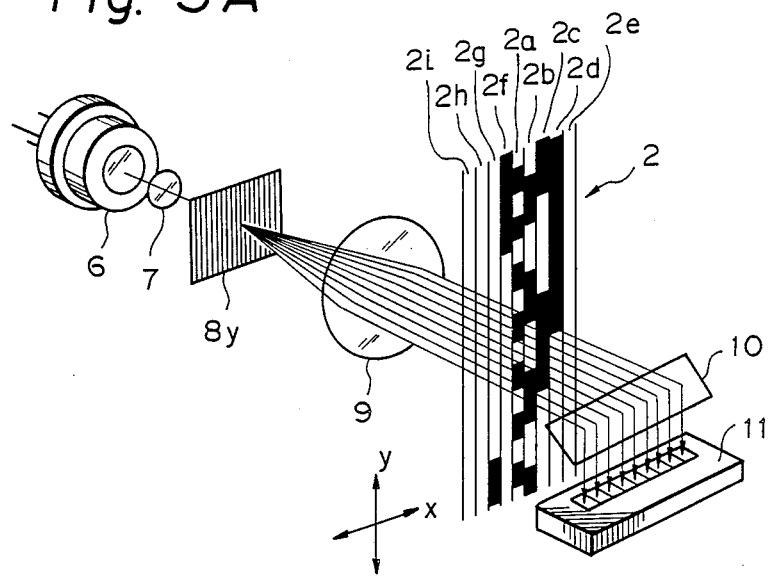
FIGS. 3A and 3B are schematic views of an optical system illustrating the principle on which a code plate is read by the encoder shown in FIG. 2.
Figure 3B:
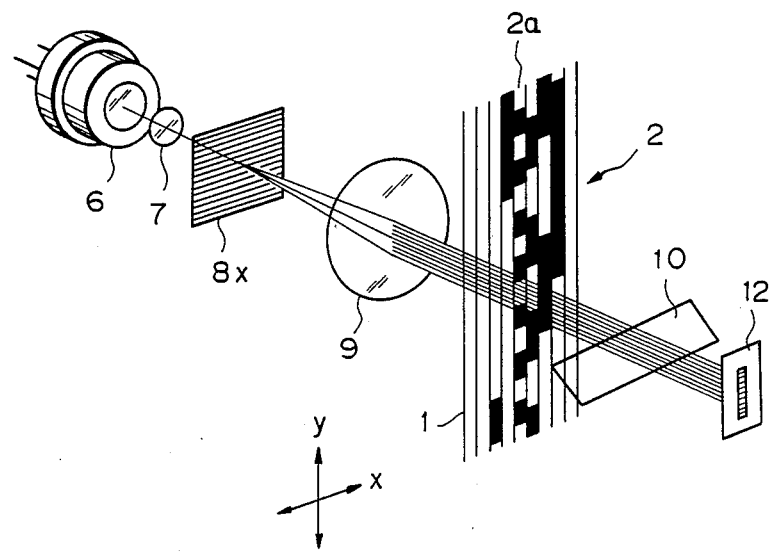

FIGS. 3A and 3B illustrate a beam applied to the code plate 2 of FIG. 2. In the present embodiment, the tracks of the code plate 2 comprise nine tracks 2a–2i, and each of the tracks 2a–2i is comprised of a slit having a plurality of transmitting areas and non-transmitting areas. The slit of each of the tracks arranged radially of the rotational scale 1 constitutes a gray binary code. Thus, this code plate stores therein data at 29 angles.

In the present embodiment, use is made of a code plate in which a track 2a having a code of the shortest inversion period corresponding to the least significant bit of the data row is disposed at the center of the plurality of tracks so that, of the diffracted lights diffracted in the directions x and y by the orthogonal diffraction grating plate 8, the central light beam corresponding to the 0-order diffracted light enters the track 2a. In this connection, it should be noted that each of tracks 2a–2i has a predetermined inversion period. The plurality of diffracted lights diffracted in the direction x by the orthogonal diffraction grating plate 8 enter the corresponding tracks 2a–2i on the rotational scale 1. At this time, the diffracted light having entered the transmitting portion of the slit of each of the tracks 2a–2i is transmitted therethrough, and a group of the plurality of diffracted lights diffracted in the diametrical direction (direction x) orthogonal to the direction of displacement of the rotational scale 1 is reflected by the half-mirror 10 and enters each light-receiving element of the light-receiving element array 11 comprising light-receiving elements corresponding to the tracks 2a–2i.

Also, a group of the plurality of diffracted lights diffracted in the same circumferential (or tangential) direction (direction y) as the direction of displacement of the rotational scale 1 which enters the track 2a enters the transmitting portion on the track 2a, whereupon it is transmitted through the half-mirror 10 as shown in FIG. 3B and enters each light-receiving element of the light-receiving element array 12.

The signal obtained from the light-receiving element array 11 is a combination of the data of the tracks in the rotational scale 1 which is the object to be measured, and is a binarized code read by a well-known absolute encoder, and the absolute position (angle) of the object to be measured is found from this signal. Here, the number of tracks of the rotational scale 1 is 9, and in the case of a code plate using a gray binary code, the resolving power is $2^9$ as previously mentioned.

On the other hand, the signal obtained from the light-receiving element array 12 is a signal indicative of the inverted position of the code on the track 2a which is output in accordance with the rotation of the rotational scale 1, i.e., the movement of the code of the track 2a.

In the present embodiment, design is made such that nine beams enter one code (slit) of the track 2a, and the light-receiving element array 12 also comprises nine light-receiving elements.

Figure 4:
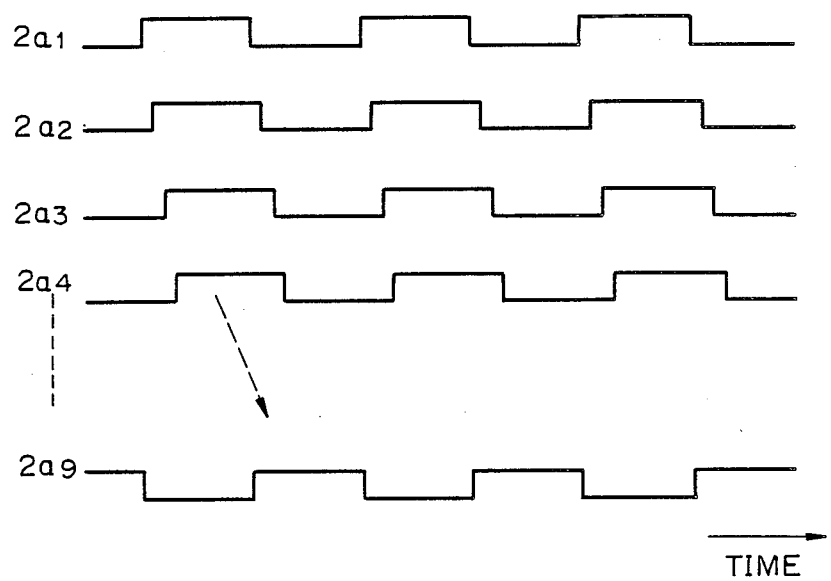
FIG. 4 illustrates output signals obtained from a light-receiving element array 12 shown in FIG. 2.

FIG. 4 illustrates output signals then obtained from the light-receiving elements 2a1–2a9 of the light-receiving element array 12. From FIG. 4, it is seen that from the relation between the output signals from the light-receiving elements 2a1–2a9 at a certain time, the location at which the code (binarized data) of the track 2a is inverted and the direction thereof are detected to thereby detect the amount and direction of deviation of the detected position in the data of the track 2a to the data inverting position.

The output signals of the light receiving element array 12 are output parallel in terms of time or time-serially and are converted into digital signals indicative of the inverted position and direction of the code of the track 2a by a subsequent processing circuit, whereafter they are output from the processing circuit. Discrimination of the direction is accomplished by comparing the output signal of one of the light-receiving elements 2a1–2a9 in which the code has been inverted at a certain time with the output signal of the light-receiving element adjacent to said one light-receiving element. The least significant data (bit) of the absolute position signal obtained from the light-receiving element array 11 is subdivided by the use of the signal indicative of the direction and the inverted position to thereby measure a finer absolute position interpolated in the code (the slit forming the non-transmitting area and the transmitting area) in the track 2a.

That is, in the present invention, in addition to the binary code which is the position (angle) information of the rotational scale 1 obtained from the first detecting means, the positional information of the code in a particular track obtained from the second detecting means is used to thereby form an absolute position signal of enhanced resolving power as compared with that in the prior art. As described above, the positional information of the code in this particular track is provided on the basis of the state in which the inverted position of the code projected onto the second detecting means comprising the light-receiving element array 12 is projected onto the light-receiving element array 12.

Also, in the above-described embodiment, a plurality of potentials may be produced stepwise in conformity with the amount and direction of deviation of the data to the inverted position and transmitted and output as an analog amount, or this analog amount may be converted into a digital signal and output to thereby find a subdivided absolute position signal.

Alternatively, each time the location at which the binarized data is inverted changes, pulses may be generated and they may be counted to thereby find the amount of deviation to the boundary position and find a subdivided absolute position signal.

In the present embodiment, a row of slits is disposed on the rotational scale 1 and the ON/OFF of the transmitted light is detected by each light-receiving element, but alternatively, a rotational scale having a row of slits comprising a reflecting portion and a non-reflecting portion may be utilized to detect the ON/OFF of reflected light.

Where the interval between the beams caused to enter the tracks 2a is made minute to thereby increase the number of beams and achieve a high resolving power, for example, a CCD (a solid state image pickup device) having a minute picture element pitch or a sensor array may be used instead of the light receiving element array 12 to output a signal time-serially.

It is desirable that the detection of the position of an absolute type encoder be accomplished quickly and accurately, but when the rotational scale of an encoder of the high resolving power type having a number of tracks is rotated at a high speed, the frequency of the output signal thereof will become high and the signal processing system is liable to become large-scale. However, if as in the present invention, the number of tracks is decreased and the inversion period of the code of each track is made relatively long, any increase in the frequency of the output signal can be prevented even if the rotational scale is rotated at a high speed, and the signal processing system will become easy to construct. Moreover, detection of a finer absolute position can be accomplished by the output signal from the light-receiving element array 12 and therefore, after all, a small rotational scale and a light-receiving element signal processing system of low response frequency will suffice to obtain the same resolving power, and this leads to merits such as the compactness of the whole and the simplification of the electrical system.

Particularly, if a CCD is used, precision interpolation can he done and it will become easy to reduce the number of tracks in an encoder of the high resolving power type and reduce the number of transmission lines to thereby simplify the encoder output wiring.

Figure 5A:
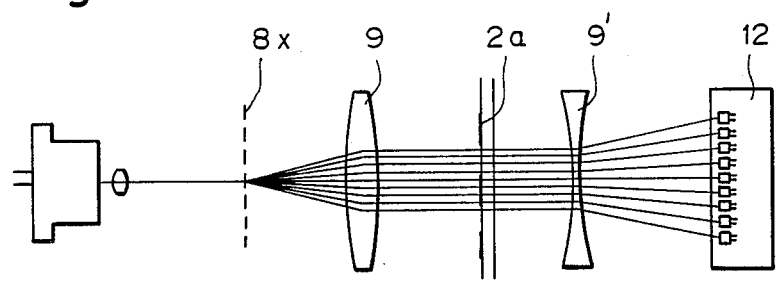
FIGS. 5A–5C schematically show modifications of the encoder shown in FIG. 2.

To effect precision interpolation, it is better to reduce the intervals between the beams entering the tracks, but the size and arrangement pitch of the elements of the light-receiving element array 12 as shown in FIG. 2 cannot be made very small. So, in order to widen the intervals between the beams entering the light-receiving element array 12, an enlarging optical system 9' is disposed before the light-receiving element array 12 as shown in FIG. 5A, or an arrangement in which the row of slits is enlargedly projected is adopted depending on the direction of the light beam entering the rotational scale 1 and the positional relation between the rotational scale and the light-receiving element array.

Figure 5B:
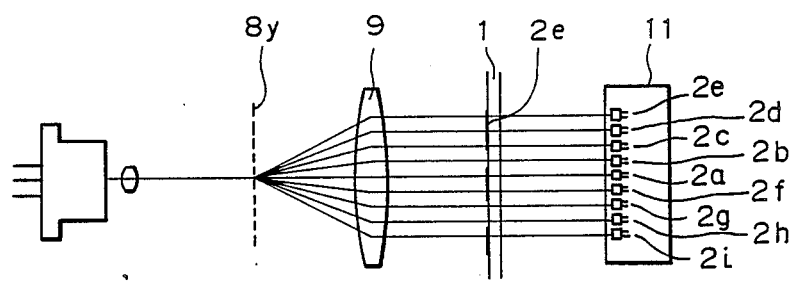
Figure 5C:
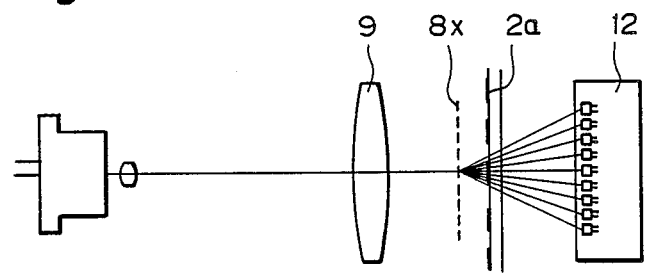

Also, two diffraction grating plates in which the directions of arrangement of diffraction gratings are orthogonal to each other may be used instead of the orthogonal diffraction grating plate 8. In such case, if a diffraction grating plate 8x in direction x is disposed in proximity to the code plate 1 as shown in FIG. 5C, the information regarding the movement of the tracks will be enlargedly projected onto the light-receiving element 12. FIG. 5B is a cross-sectional view of the optical system taken on a plane orthogonal to FIG. 5C.

While in the present embodiment, there has been shown a rotary encoder for reading the data of the rotational scale, the present invention is equally applicable to a linear encoder for reading the data of a linear scale.

Also, in the present embodiment, a plurality of light beams comprising diffracted lights formed by means of the orthogonal diffraction grating plate 8 ar applied to the code pate on the rotational scale 1, but alternatively, a cruciform beam comprising two linear light beams formed by the use of a cylindrical lens or the like and crossed perpendicularly to each other may be caused to enter the code plate. In this case, the cruciform beam is applied to the scale so that the first linear light beam has its lengthwise direction in the direction of arrangement of the tracks of the scale and the second linear light beam has its lengthwise direction in the direction of movement (rotation) of the scale.

What is claimed is:

1. A position detecting apparatus for detecting a position of a scale, with the scale having a plurality of tracks thereon and each of the tracks having a predetermined pattern arrangement to form a code, comprising:
   a radiation source;
   an illumination system for illuminating the scale with a radiation beam from said radiation source, said illumination system including diffraction means for generating a plurality of diffracted beams from said radiation beam, said illumination system directing a first beam group to the plurality of tracks, with the first beam group having a diffracted beam corresponding to each of the plurality of tracks, and said illumination system directing a second beam group to a predetermined track of the plurality of tracks, with the beams in the second beam group being aligned along a direction of movement of the scale on which the predetermined track extends such that all of the beams of the second beam group are incident on the pattern of the predetermined track; and
   a detecting system for detecting said first and second beam groups modulated by each pattern on the plurality of tracks, said detecting system including a first sensor array for receiving the first beam group and outputting a first signal corresponding to the code, and a second sensor array for receiving the second beam group and outputting a second signal corresponding to the displacement of the pattern of the predetermined track, wherein the position of the scale is determined on the basis of said first and second signals.

2. An apparatus according to claim 1, wherein said radiation source includes a laser element.

3. An apparatus according to claim 2, wherein said illumination system comprises:
   a first optical system for collimating the radiation beam from said laser element and directing the collimated beam to said diffraction means; and
   a second optical system for focusing each beam of the first and second beam groups onto the scale, said second optical system having a predetermined focal length and being disposed so that the distance between said second optical system and said diffraction means is substantially the same as the distance between said second optical system and the scale.

4. An apparatus according to claim 3, wherein the predetermined track is the track with the shortest pattern arrangement.

5. A position detecting apparatus for detecting a position of a scale, with the scale having a plurality of tracks thereon and each of the tracks having a predetermined pattern arrangement to form a code, comprising:
   a radiation source;
   an illumination system for illuminating the scale with a radiation beam from said radiation source, said illumination system producing first and second linear shaped beams intersecting each other, and directing said first linear shaped beam to the plurality of tracks and directing said second linear shaped beam to a predetermined track of the plurality of tracks, wherein said first and second linear shaped beams are incident on the scale so that the longitudinal direction of said first linear shaped beam is substantially perpendicular to a moving direction of the scale along which the plurality of tracks extend and the longitudinal direction of said second linear shaped beam is substantially coincident with the moving direction of the scale; and
   a detecting system for detecting said first and second linear shaped beams modulated by each pattern on the plurality of tracks, said detecting system including a first sensor array for receiving said first linear shaped beam and outputting a first signal corresponding to the code, and a second sensor array for receiving said second linear shaped beam and outputting a second signal corresponding to the displacement of the pattern of the predetermined track, wherein the position of the scale is determined on the basis of said first and second signals.

* * * * *

UNITED STATES PATENT AND TRADEMARK OFFICE
CERTIFICATE OF CORRECTION

PATENT NO. : 4,933,673
DATED : June 12, 1990
INVENTOR(S) : Ishizuka, et al.

It is certified that error appears in the above-identified patent and that said Letters Patent is hereby corrected as shown below:

ON THE TITLE PAGE,

[57] ABSTRACT:

Line 7, "plurality of tracks" should be deleted.

COLUMN 1:

Line 10, "raw" and "row" should be deleted.

Line 21, "for" should read --or for--.

COLUMN 2:

Line 9, "inaction" should read --invention--.

Line 12, "by" should be deleted.

COLUMN 5:

Line 48, "code pate" should read --code plate--.

Signed and Sealed this

Fifth Day of May, 1992

Attest:

DOUGLAS B. COMER

*Attesting Officer*      Acting Commissioner of Patents and Trademarks